United States Patent
Massoudi

(10) Patent No.: US 6,363,511 B1
(45) Date of Patent: Mar. 26, 2002

(54) DEVICE AND METHOD FOR DECODING DATA STREAMS FROM STORAGE MEDIA

(75) Inventor: Firooz Massoudi, Santa Clara, CA (US)

(73) Assignee: STMicroelectronics N.V., The Netherlands ( * ) Notice: Subject to any disclaimer, the term of this patent is extended or adjusted under 35 U.S.C. 154(b) by 0 days.

(21) Appl. No.: 09/052,912

(22) Filed: Mar. 31, 1998

(51) Int. Cl.$^7$ ............................................. H03M 13/29
(52) U.S. Cl. ...................................... 714/755; 714/769
(58) Field of Search ................................ 714/755, 756, 714/758, 761, 762, 769

(56) References Cited

U.S. PATENT DOCUMENTS

| | | | |
|---|---|---|---|
| 4,637,021 A | * 1/1987 | Shenton | 371/37 |
| 4,683,469 A | 7/1987 | Ellsmore et al. | 345/14 |
| 4,750,178 A | * 6/1988 | Sako et al. | 371/37 |
| 5,313,475 A | 5/1994 | Cromer et al. | 371/40.1 |
| 5,453,996 A | * 9/1995 | Nakamura | 371/37.5 |
| 5,551,009 A | 8/1996 | Amini et al. | 395/492 |
| 5,719,884 A | * 2/1998 | Roth et al. | 371/37.4 |
| 5,805,564 A | * 9/1998 | Kobayashi et al. | 369/275.3 |
| 5,805,617 A | 9/1998 | Im | 371/37.12 |
| 5,829,007 A | 10/1998 | Wise et al. | 711/5 |
| 5,917,836 A | * 6/1999 | Ichikawa et al. | 371/37.4 |
| 5,920,578 A | 7/1999 | Zook | 714/753 |
| 5,970,208 A | 10/1999 | Shim | 386/126 |
| 5,978,958 A | * 11/1999 | Tanaka et al. | 714/804 |
| 5,991,911 A | * 11/1999 | Zook | 714/758 |
| 6,032,283 A | * 2/2000 | Meyer | 714/746 |

OTHER PUBLICATIONS

Jim Taylor, "*DVD demystified: the guidebook for DVD-video and DVD-ROM*", CH. 3 and 4, ® 1998, McGraw–Hill, Inc., New York, NY.

Chang, H.C., Shung, C., "A Reed–Solomon Product–Code (RS–PC) decoder for DVD applications," 1998 Solid State conference, Digest of Technical papers. Feb. 5–7 1998.

* cited by examiner

*Primary Examiner*—Stephen M. Baker
(74) *Attorney, Agent, or Firm*—Lisa K. Jorgenson; Steven H. Slater

(57) ABSTRACT

A device for detecting and correcting errors in error correction coded (ECC) data blocks that are read sequentially from a DVD medium is disclosed. Each ECC data block is defined as a two dimensional block of a plurality of columns and rows. Each of the ECC data blocks is read from the DVD medium sequentially in rows. The device includes row correction circuitry, a buffer, column correction circuitry, and repeat correction circuitry. The row correction circuitry is configured to sequentially receive the rows of an ECC data block for detecting and correcting up to a first predetermined number of errors in each of the received rows. The buffer is coupled to the row correction circuitry for receiving the error corrected rows of the ECC data block as a receiving buffer. The buffer also stores the ECC data block as a correction buffer when all the rows of the ECC data block have received. The column correction circuitry is coupled to the row correction circuitry and the buffer to sequentially receive the row error corrected rows of the ECC data block for detecting the uncorrected errors. The column correction circuitry is also configured to correct the uncorrected errors in the columns of the ECC data block that is stored in the correction buffer. The repeat correction circuitry is coupled to the buffer for detecting and correcting the remaining uncorrected errors in the correction buffer.

74 Claims, 8 Drawing Sheets

FIG. 2B
(PRIOR ART)

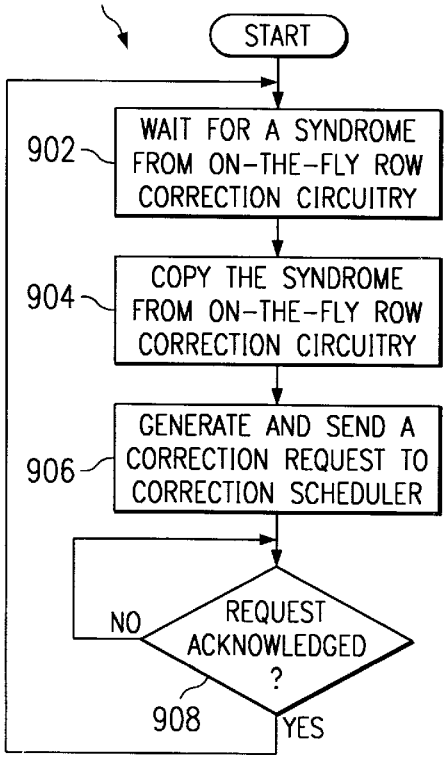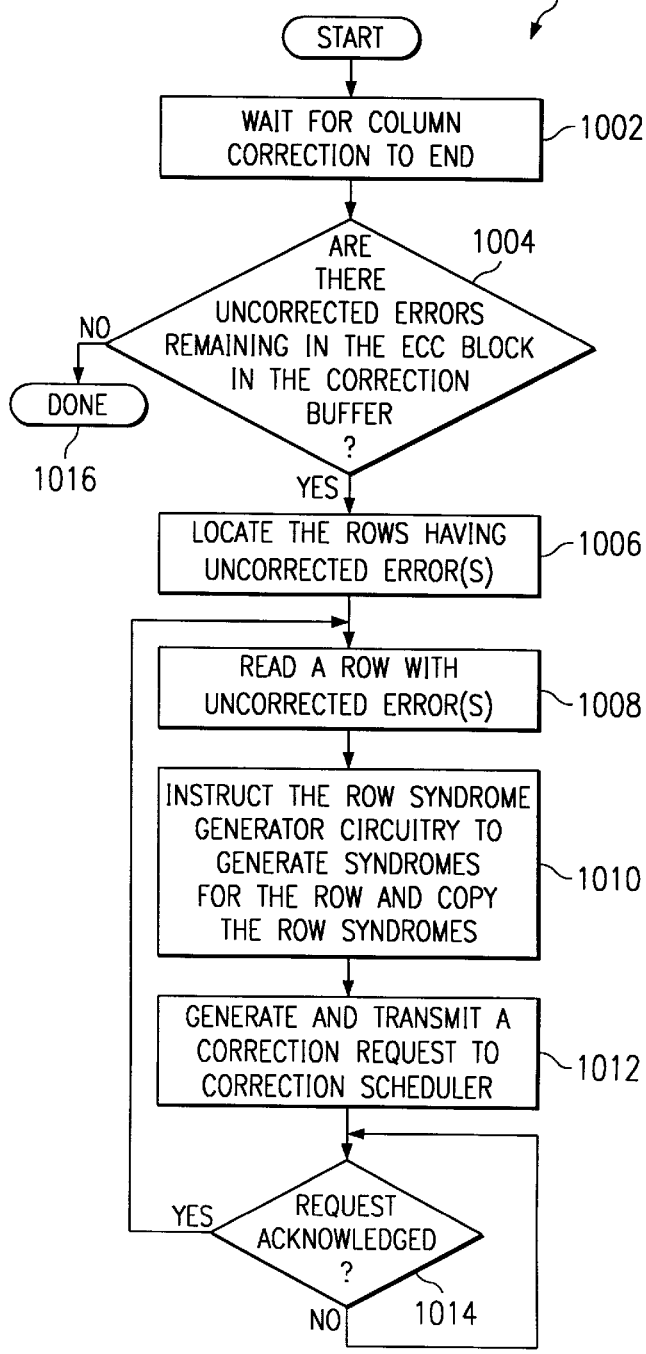

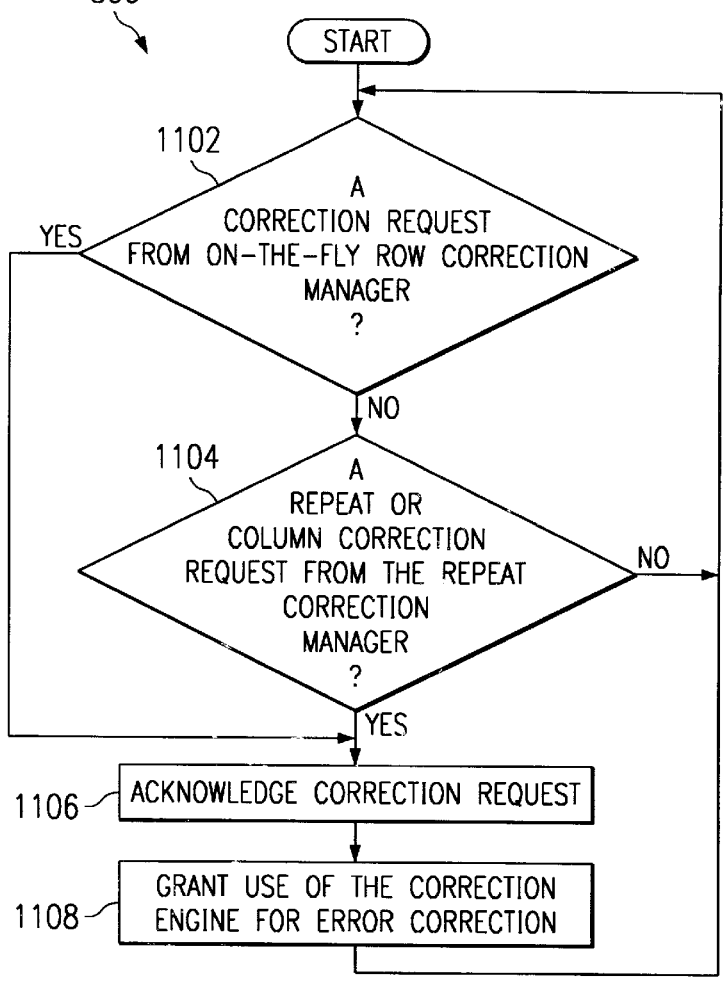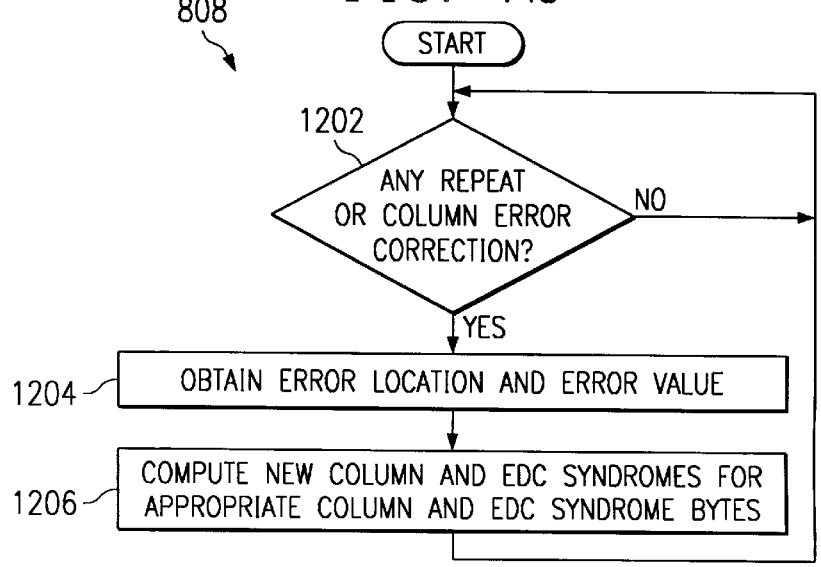

DEVICE AND METHOD FOR DECODING DATA STREAMS FROM STORAGE MEDIA

CROSS REFERENCE TO RELATED APPLICATIONS

The present application claims is related to co-pending U.S. patent application Ser. No. 09/052,917 filed on an even day herewith, entitled "Device and Method for Real Time Correction of Row Data from DVD Media," by inventor Firooz Massoudi, assigned to the assignee of the present application, which is incorporated herein by reference.

BACKGROUND OF THE INVENTION

1. Field of the Invention

This invention relates generally to error detection and correction devices, and more particularly to devices used in detecting and correcting data read from DVD media.

2. Description of the Related Art

In recent years, optical disc technology has gained popularity in the computer and entertainment industries. For example, by providing superior digital sound quality, CD players and discs have effectively displaced phonographs in the music industry. In addition, CD-ROM technology has also become popular in the computer industry as well for recording and reading large amounts of information or data.

However, in response to an ever increasing demand for convenient storage devices with even greater storage capacity, a new optical media known as digital video disc or digital versatile disc (DVD) has emerged as a promising new technology. The DVD media technology provides many times the storage capacity of a conventional CD-ROM disc. For example, a DVD medium may store data from 4.7 gigabytes up to 18 gigabytes. In contrast, conventional CD-ROM discs are usually only capable of storing about 650 Megabytes of data. Of course, the capacity of a DVD medium may surpass 18 Gigabytes in the near future as the technology improves.

Information in a DVD medium is stored in a similar manner as the traditional CD-ROM disc. Prior Art FIG. 1A illustrates a DVD medium 100 having a center hole 104. In the DVD medium 100, data is typically stored in units of sectors that are laid out in a continuous spiral 102 from the center hole 104 and extending through to the circumference of the DVD medium 100. Sectors are laid out along the spiraling track 102. For example, a portion 106 of the spiraling track 102 may include numerous sequential sectors.

Prior art FIG. 1B illustrates a more detailed layout of the portion 106 of the spiraling track 102 in the DVD medium 100. The portion 106 includes five sequential sectors 110, 111, 112, 113, and 114 (i.e., 110 through 114). Each of the sectors 110 through 114 stores user data of 2064 bytes.

Each of the sectors 110 through 114 contains a header field 120 and a data field 122. The header field 120 is typically assigned sixteen bytes. Of these sixteen bytes, the first four bytes store the sector number for identifying the sector, and the remaining bytes are used to store information related to error detection, copy protection, and payload error detection.

Often however, user data stored in or read from a DVD medium may become corrupted or contaminated. For example, contamination or corruption can occur for reasons such as scratches, dust, noise, and other imperfections. The contamination or corruption typically causes two types of errors: a random error and a burst error. The random error refers to a single bit of error. On the other hand, the burst error refers to an error involving a set of contiguous bits.

To protect against such random and burst errors, DVD technology typically implements an error correction code (ECC) block coding scheme. In the ECC block coding scheme, user data is organized into blocks of data sectors and ECC bytes. Prior Art FIG. 2A illustrates the organization of an exemplary ECC block 200. The block 200 includes 16 sectors from sector 0 through sector 15. As will be discussed below, each of the 16 sectors includes 12 rows. For example, the first sector 202 (i.e., sector 0) includes 12 rows. Each of the rows includes 172 columns or column bytes labeled 0 through 171.

In the ECC block 200, both the rows and columns of the ECC block 200 include check bytes for error detection and correction. Check bytes are well known in the art and are also referred to parity bytes, check symbols, redundancy symbols, etc. The ECC block 200 includes row check bytes 204 and column check bytes 206. Each of the rows of the 16 sectors includes 10 row check bytes 204 (i.e., inner parity or PI) appended after the last byte in the corresponding row. Each of the 172 columns and the row check bytes 204 includes 16 column check bytes 206 (i.e., outer parity or PO) appended after the last byte in the corresponding column. Thus, the data and check bytes in the ECC block 200 are logically organized in a two dimensional structure.

Prior Art FIG. 2B shows the individual rows and columns of the ECC block 200. The ECC block 200 depicts 208 rows from row 0 through row 207. Since 12 rows make up a data sector, the ECC block 200 contains 16 sectors occupying 192 rows from row 0 through row 191. For example, the first sector 202 includes 12 rows from row 0 through row 11. The ECC block 200 contains column check bytes in the remaining 16 rows 206 from row 192 through row 207. The last four bytes in a sector (e.g., sector 202) are error-detection code (EDC) bytes 210 used as an additional error detection bytes for a sector.

With continuing reference to Prior Art FIG. 2B, the ECC block 200 also shows 182 columns from column 0 through column 181. Each row in the ECC block 200 contains 172 user bytes and 10 row check bytes for a total of 182 bytes. These 182 bytes define the columns 0 through 181, respectively. The 10 row check bytes are appended to the end of a row as shown in columns 172 through 181 for error detection and correction.

As mentioned previously, a data sector is split into 12 rows of 172 bytes each. One data sector typically contains 12 bytes of header, 2048 bytes of user data, and 4 bytes of EDC for a total of 2064 bytes. Prior Art FIG. 2C illustrates a physical sector 250 including 13 rows from row 0 through row 12. The physical sector 250 is first generated by converting a data sector into a recording sector, which is generated by adding and interleaving check bytes. Specifically, 10 bytes of row check bytes (i.e., inner parity or PI bytes) are generated and added to each row and 16 column check bytes (i.e., outer parity bytes) are generated and added to each column. Then, column check bytes are interleaved between 16 sectors of user data such that each sector is followed by a row of column check bytes. Accordingly, each recording sector consists of 13 rows of 182 bytes each.

The recording sector is then converted to the physical sector 250 by splitting the recording sector down the middle and adding a 1-byte sync code 252 in front of each half-row. In addition, the data is processed with an 8-to-16 modulation (EFM plus), which replaces each byte with a 16-bit code.

This conversion process results in the creation of 16 blocks of physical sectors within an ECC block. Each of the physical sectors consists of 4836 bytes. The physical sector data are then sequentially written out row by row to a DVD medium as channel data starting with the first sector in the ECC block. The first sector of the next ECC block immediately follows the last sector of the current ECC block.

Prior Art FIG. 3 illustrates a block diagram of a DVD decoder system 300 for detecting and correcting errors in an ECC block. In this system 300, a disc controller 302 sequentially receives a stream of ECC block data from a DVD medium and identifies sync bytes for detecting the rows. The disc controller 302 transmits the detected rows of the ECC block data into an ECC buffer 304. The DVD decoder system 300 assembles the rows into an ECC block in the ECC buffer 304. When a full ECC block has been assembled or stored in the ECC buffer 304, the error detection and correction circuitry 306 accesses the ECC buffer 304 to read the data that are stored in the ECC buffer 304. The error detection and correction circuitry 306 then performs row and column corrections using the accessed data. If either the row or column errors can not be corrected, the data in the ECC buffer 304 is accessed again for repeat correction. Finally, when the data has been detected and corrected, the corrected data is transmitted to a host 308.

Unfortunately, waiting for a full ECC block to be available before performing error correction results in significant performance degradation. For example, waiting for the complete assembly of the full ECC block in the ECC buffer 304 has the disadvantage of delaying error detection and correction processing. This delay in error detection and correction processing generally translates into more time to complete the error correction processing. Furthermore, the error correction circuitry may sit idle when waiting for the full ECC block to be assembled in the ECC buffer 304. In such cases, the idle time translates into loss in valuable processing resources, thereby increasing hardware cost.

In addition, the DVD decoder system 300 requires a relatively large buffer bandwidth since all data is stored to and accessed from the single ECC buffer 304. Specifically, each access requires full buffer bandwidth. For example, storing the rows of the ECC block data into the ECC buffer 304 requires 12 megabytes/second of buffer bandwidth at 8x speed of a DVD drive. Similarly at the 8x speed, row correction, column correction, repeat correction, and writing to the host 308 each requires 12 megabytes/second of bandwidth. Hence, the DVD decoder system 300 would typically require a total of 80 to 90 megabytes/second of buffer bandwidth taking into account the efficiency of the buffer manager. Since more bandwidth requires more hardware resources, the DVD decoder system 300 is relatively expensive to implement due to its large bandwidth requirement.

In view of the foregoing, what is needed is a device and method that can detect and correct errors in an ECC block data without waiting for an entire ECC block to be assembled in a buffer. What is further needed is a device and method that can perform error detection and correction with less buffer bandwidth.

SUMMARY OF THE INVENTION

Broadly speaking, the present invention fills these needs by providing a device, method, and system for detecting and correcting errors in ECC block data as it is read sequentially from a DVD medium. It should be appreciated that the present invention can be implemented in numerous ways, including as a process, an apparatus, a system, a device, a method, or a computer readable medium. Several inventive embodiments of the present invention are described below.

In one embodiment, the present invention provides a device for detecting and correcting errors in error correction coded (ECC) data blocks that are read sequentially from a DVD medium. Each ECC data block is defined as a two dimensional block of a plurality of columns and rows. Each of the ECC data blocks is read from the DVD medium sequentially in rows. The device includes row correction circuitry, a buffer, column correction circuitry, and repeat correction circuitry. The row correction circuitry is configured to sequentially receive the rows of an ECC data block for detecting and correcting up to a first predetermined number of errors in each of the received rows. The buffer is coupled to the row correction circuitry for receiving the error corrected rows of the ECC data block as a receiving buffer. The buffer also stores the ECC data block as a correction buffer when all the rows of the ECC data block have received. The column correction circuitry is coupled to the row correction circuitry and the buffer to sequentially receive the row error corrected rows of the ECC data block for detecting the uncorrected errors. The column correction circuitry is also configured to correct the uncorrected errors in the columns of the ECC data block that is stored in the correction buffer. The repeat correction circuitry is coupled to the buffer for detecting and correcting the remaining uncorrected errors in the correction buffer.

In another embodiment, the present invention provides a method for detecting and correcting errors in ECC data blocks, each of which comprising a plurality of rows and columns. The method sequentially receives the rows of an ECC data block. Then, the method detects errors in each of the received rows of the ECC data block and corrects up to a first predetermined number of the errors in each of the rows in the ECC data block. Each of the corrected rows is then stored in a storage unit. While storing the corrected rows, the method of the present invention receives each of the corrected rows sequentially for detecting the uncorrected errors in the columns of the ECC data block. The method then corrects the uncorrected errors in the columns of the ECC data block when all the rows of the ECC data block has been stored.

In yet another embodiment, the device includes a receiving means, a row error detecting means, a row error correcting means, a storing means, a column error detecting means, and a column error correcting means. The receiving means sequentially receives the rows of an ECC data block. The row error detecting means detects errors in each of the received rows of the ECC data block and the row error correcting means corrects up to a first predetermined number of the errors in each of the rows in the ECC data block. The storing means stores each of the corrected rows. The column error detecting means receives each of the corrected rows sequentially and detects the uncorrected errors in the columns of the ECC data block while each of the corrected rows are being stored. The column error correcting means corrects the uncorrected errors in the columns of the ECC data block when all the rows of the ECC data block has been stored.

Advantageously, the present invention provides a device and method that can detect and correct errors in the rows of an ECC block data without waiting for an entire ECC block to be assembled in a buffer. Furthermore, the device and method of the present invention performs column corrections, and repeat corrections if necessary, as soon as all the rows of the ECC block have been received. In addition, the present invention requires less buffer bandwidth to access the buffer in the error detection and correction process. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

Prior art

Prior Art

Prior Art FIG. 2B shows the individual rows and columns of the exemplary ECC block.

Prior Art

Prior Art

FIG. 9 shows a flow diagram of exemplary operations of the on-the-fly row correction manager.

FIG. 10 illustrates a flow diagram of exemplary operations performed in the repeat correction manager.

FIG. 11 illustrates a flow chart of exemplary operations performed by the correction scheduler.

FIG. 12 shows a flow chart of exemplary operations performed by the syndrome update circuitry.

DETAILED DESCRIPTION OF THE PREFERRED EMBODIMENTS

An invention is described for a device, method, and system for detecting and correcting errors in ECC block data that are read sequentially from a DVD medium. It will be obvious, however, to one skilled in the art, that the present invention may be practiced without some or all of these specific details. In other instances, well known process operations have not been described in detail in order not to unnecessarily obscure the present invention.

Figure 1A:
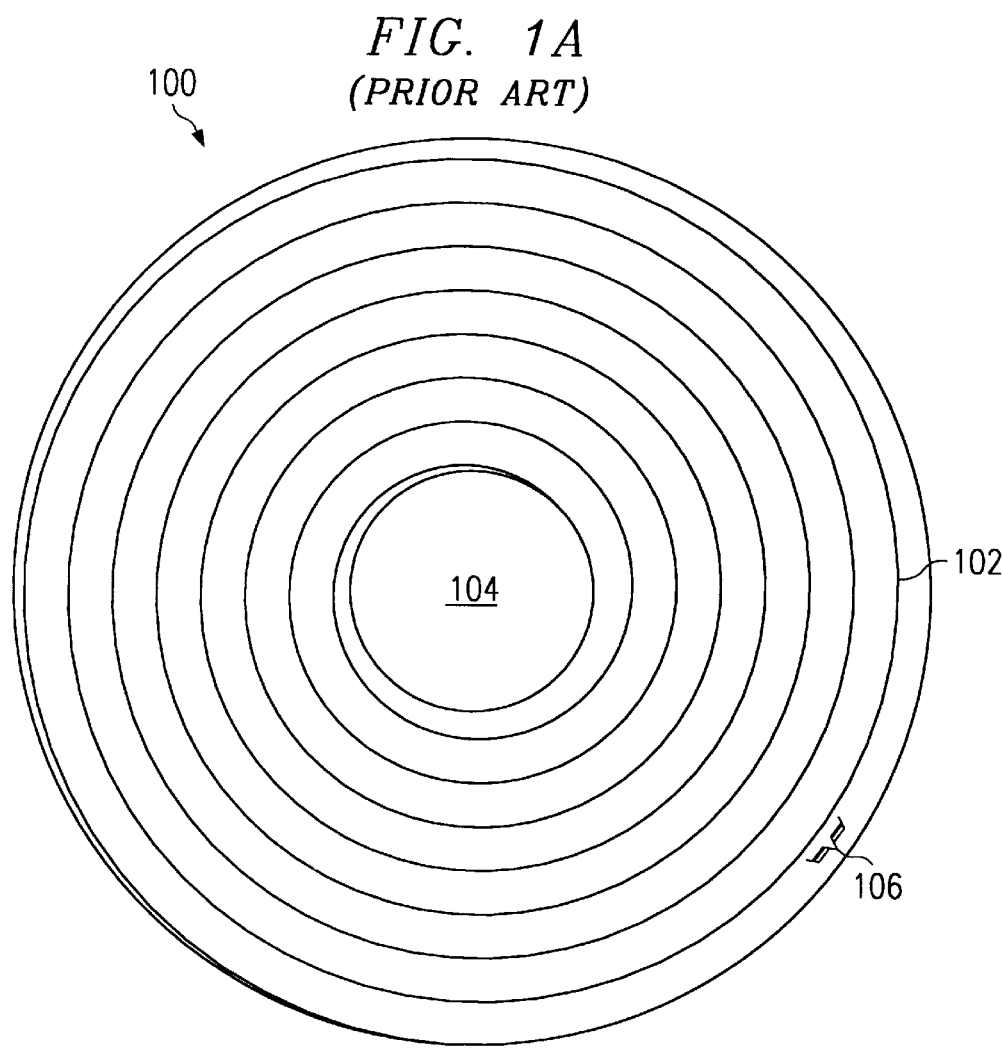
FIG. 1A illustrates a DVD medium having a center hole 104.
Figure 1B:
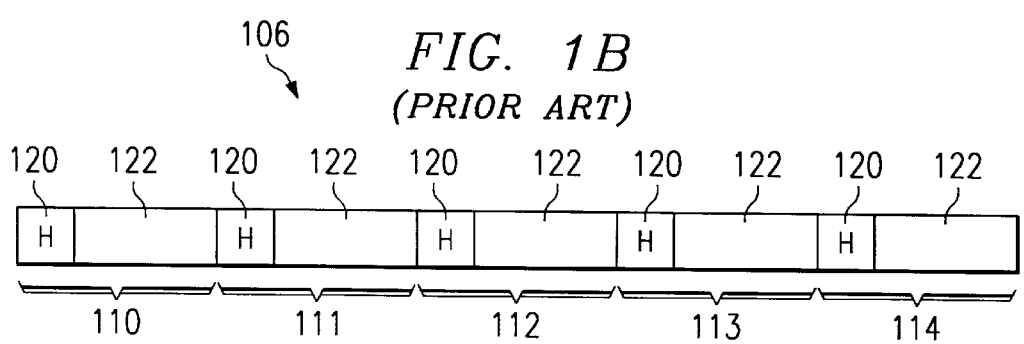
FIG. 1B illustrates a more detailed layout of a portion of the spiraling track in the DVD medium.
Figures 2A, 2C:
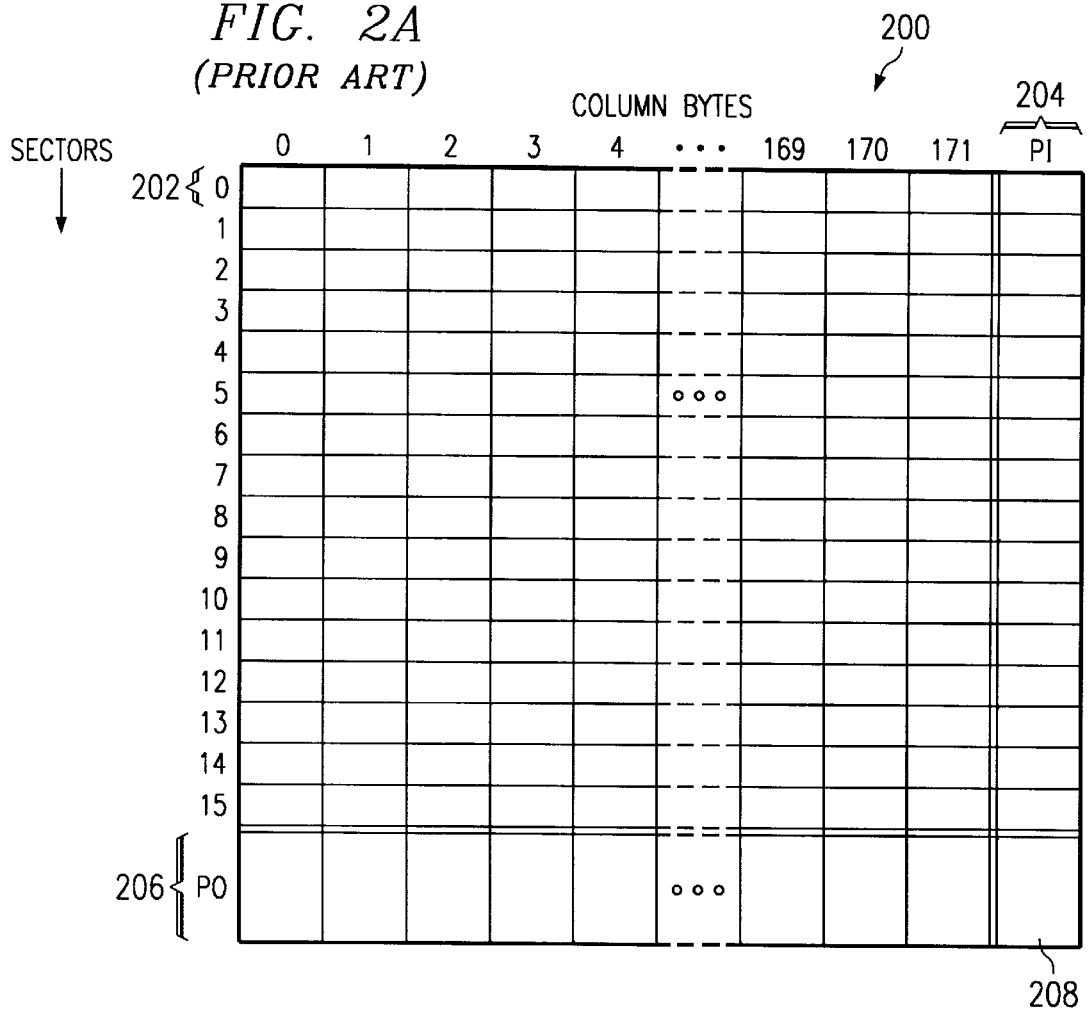
FIG. 2A illustrates organization of an exemplary error correction code (ECC) block.
FIG. 2C illustrates a physical sector including 13 rows from row 0 through row 12.
Figure 3:
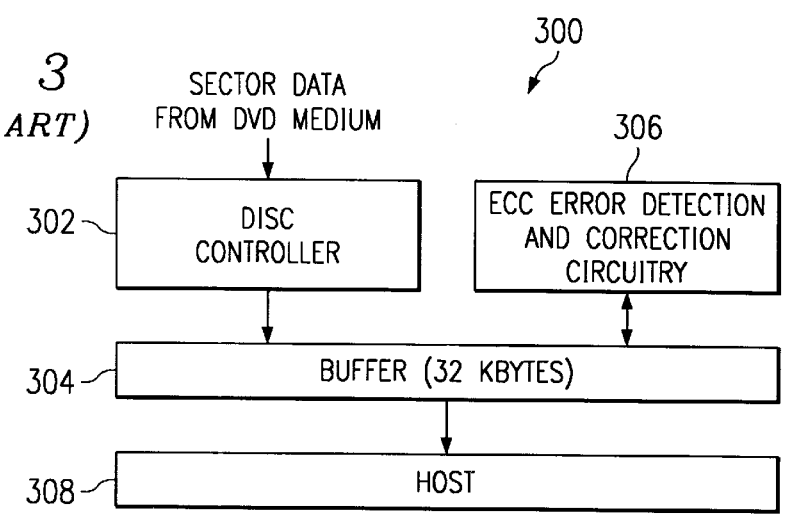
FIG. 3 illustrates a block diagram of a DVD decoder system for detecting and correcting errors in an ECC block.
Figure 4A:
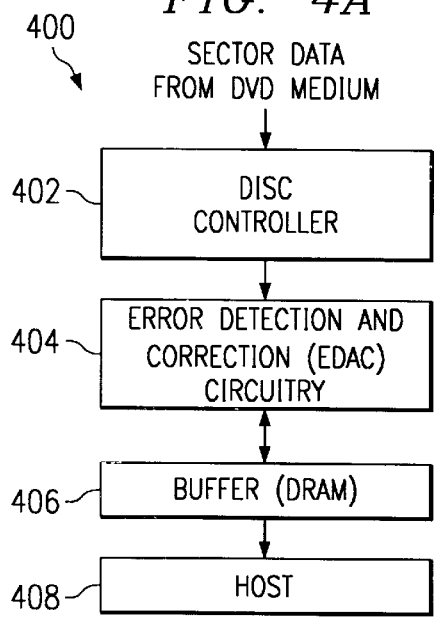
FIG. 4A illustrates a block diagram of a DVD error correction system for detecting and correcting random and burst mode errors of data in an ECC block in accordance with one embodiment of the present invention.

FIG. 4A illustrates a block diagram of a DVD error correction system 400 for detecting and correcting random and burst mode errors of data in an ECC block in accordance with one embodiment of the present invention. In the DVD error correction system 400, a disc controller 402 receives ECC block data originating from a DVD medium. The DVD medium may be either DVD disc or a DVD-ROM disc. A DVD disc is typically played back by a DVD player for playing the DVD disc, such as an audio DVD disc, a video DVD disc, a karaoke DVD disc, etc. On the other hand, a DVD-ROM disc is read by a DVD-ROM drive for use in conjunction with a computer system. As used herein, the term DVD medium refers to both DVD disc and DVD-ROM disc.

The disc controller 402 receives the ECC block data sequentially as a data stream. The disc controller 402 detects sync marks or patterns to identify the beginning of each of the rows of the ECC block and transmits each of the detected rows sequentially to error detection and correction (EDAC) circuitry 404. Preferably, the disc controller 402 identifies and transmits each of the rows "on the fly" to the EDAC circuitry 404.

The EDAC circuitry 404 performs row, column, and repeat error corrections. Specifically, the EDAC circuitry 404 generates row syndromes and performs row correction on each of the rows on the fly. The EDAC circuitry 404 also generates column syndromes and EDC syndromes as the rows are being received. The EDAC circuitry 404 stores the rows as they are received in a buffer 406 (e.g., DRAM, SRAM, etc.). When a complete ECC block has been received and stored in the buffer 406, the EDAC circuitry 404 performs column corrections on the received ECC block stored in the buffer 406 without delay.

After performing row and column corrections, the EDAC circuitry 404 may also perform repeat corrections by repeating row and/or column corrections if errors are still present in the ECC block. In a preferred embodiment, the EDAC circuitry 404 performs repeat corrections only when the remaining errors are correctable errors. After errors have been corrected through row, column, and/or repeat error corrections, the DVD error correction system 400 transmits the corrected ECC block of data in the buffer 406 to a host 408 (e.g., host computer).

Figure 4B:
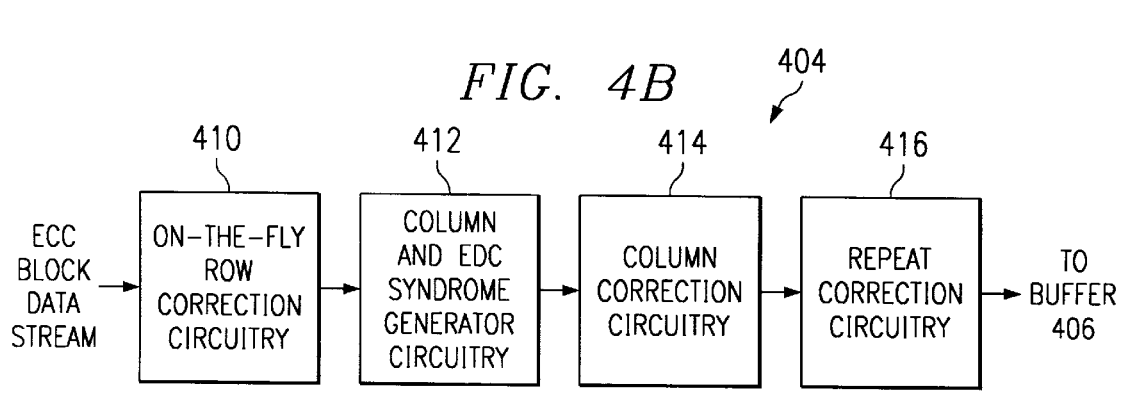
FIG. 4B illustrates a simplified block diagram of an error correction and detection circuitry (EDAC) in accordance with one embodiment of the present invention.

FIG. 4B illustrates a simplified block diagram of the EDAC circuitry 404 in accordance with one embodiment of the present invention. The EDAC circuitry 404 includes on-the-fly row correction circuitry 410, column and EDC syndrome generator circuitry 412, column correction circuitry 414, and repeat correction circuitry 416. The on-the-fly row correction circuitry 410 receives a data stream of ECC block data in rows and detects and corrects row errors on the fly up to a number of errors, which is programmable by a user. The on-the-fly row correction circuitry 410 also generates row erasure pointers to the rows that have not been corrected completely. The on-the-fly row correction circuitry 410 is described in a co-pending U.S. patent application Ser. No. 09/052,917 filed on an even day herewith, entitled "Device and Method for Real Time Correction of Row Data from DVD Media," by inventor Firooz Massoudi, which is incorporated herein by reference. Preferably, the on-the-fly row correction circuitry 410 includes a row syndrome generator circuitry for generating row syndromes on the fly.

The column and EDC syndrome generator circuitry 412 computes syndromes for all columns and also determines all the syndromes for EDC of each of the sectors in an ECC block. At the same time, the column and EDC syndrome generator circuitry 412 generates column erasure pointers indicating the columns that contain errors. As will be discussed below, the column and EDC syndrome generator circuitry 412 stores the EDC and column syndromes in a syndrome memory such as random access memory (RAM), static random access memory (SRAM), dynamic random access memory (DRAM), etc. In the preferred embodiment, the column and EDC syndrome generation is concurrent with data transfer to the buffer 406.

The column correction circuitry 414 receives and uses the column syndromes and erasure pointers to perform column corrections on the ECC block stored in the buffer 406. Column correction begins only when all the rows of the ECC block have been received in the buffer 406. Column and EDC syndromes stored in the syndrome memory are updated each time a byte of the associated column or sector in the ECC block is corrected. All uncorrectable columns are used as erasure pointers for subsequent repeat correction.

The repeat correction circuitry 416 performs correction on the rows and columns that were not corrected before. The repeat correction circuitry 416 uses the erasure pointers to access the uncorrected rows and/or columns for correction. For repeat row correction, for example, the repeat correction circuitry 416 reads, from the buffer 406, only the data pertaining to a specific row indicated by an erasure pointer and generates new row syndromes for the row. Then, corrections are made to the row data in the buffer 406. On the other hand, the repeat correction circuitry 416 uses the column syndromes stored in the syndrome memory to repeat correct columns. Column and EDC syndromes are updated each time a byte is corrected. Repeat correction continues until either all rows and columns have been corrected and stored into the buffer 406 or time frame for the ECC block expires.

In the preferred embodiment of the present invention, the ECC data block is encoded using Reed-Solomon code, which is well known in the art. Each of the rows in the ECC data block contains 10 row check bytes and each of the columns in the ECC data block contains 16 column check bytes. When the present invention corrects a row or a column, it can correct errors up to one half of the number of check bytes in the row or column. Specifically, a correction on a row can correct up to five errors for 10 row check bytes through each row correction process and a correction on a column can correct up to 8 errors for 16 column check bytes through each column correction process. Any remaining errors can be corrected subsequently using column or repeat error correction. In one embodiment, the number of errors that the row and column corrections can correct is programmable. Preferably, the row correction corrects up to three errors per row correction pass while the column correction corrects up to 5 errors per column correction pass to increase the reliability of data.

Figure 5:
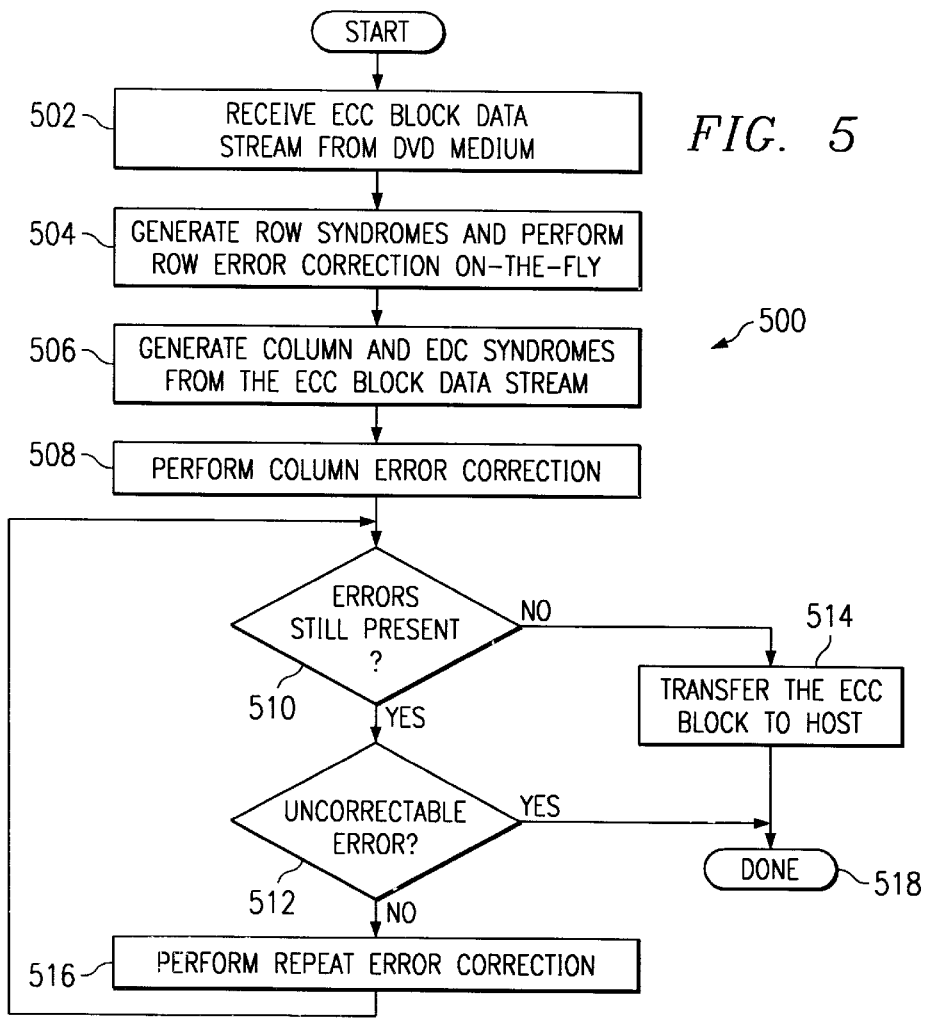
FIG. 5 shows a flow diagram of error detection and correction method in accordance with one embodiment of the present invention.

FIG. 5 shows a flow diagram of error detection and correction method 500 in accordance with one embodiment of the present invention. In operation 502, the method 500 receives ECC block data stream from a DVD medium. Preferably, the ECC block data stream is received sequentially by rows. The method 500 then generates row syndromes and performs row error correction on the fly in operation 504. Operation 506 then generates column and EDC syndromes from the ECC block data stream.

When a complete ECC block has been received, the method 500 performs column error correction in operation 508. In operation 510, if errors are still present (i.e., detected) in the ECC block, the method 500 proceeds to operation 512. If no errors are detected, then the ECC block is transferred to a host in operation 514 and the method terminates in operation 518. If the method 500 determines that the detected errors are uncorrectable errors in operation 512, the method 500 also terminates in operation 518.

On the other hand in operation 512, if the method 500 determines that the detected errors are correctable, the method 500 proceeds to perform repeat error correction in operation 516. The repeat correction in operation 516 may involve performing row and/or column corrections. After performing repeat correction in operation 516, the method 500 proceeds back to operation 510 to determine if errors are still present as mentioned above.

Figure 6:
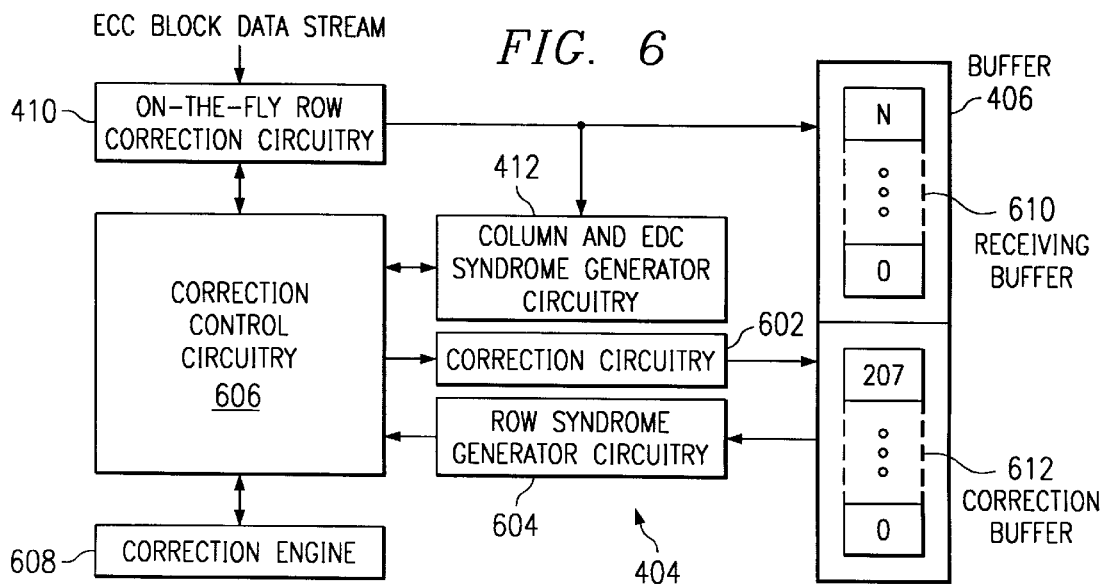
FIG. 6 illustrates a block diagram of the EDAC circuitry including a buffer in accordance with one embodiment of the present invention.

FIG. 6 illustrates a block diagram of the EDAC circuitry 404 including the buffer 406 in accordance with one embodiment of the present invention. The EDAC circuitry 404 includes row correction circuitry 410, column and EDC syndrome generator circuitry 412, correction circuitry 602, row syndrome generator circuitry 604, a correction control circuitry 606, a correction engine 608, and a buffer 406. The buffer 406 includes a receiving buffer 610 and a correction buffer 612.

With reference to FIG. 6, the row correction circuitry 410 detects and corrects, on the fly, up to a number of row errors in each row depending on the number of row check bytes. The row correction circuitry 410 generates row syndromes, which are then transmitted to the correction control circuitry 606. As will be discussed below, the correction control circuitry 606 generates correction requests for the row correction circuitry and uses the correction engine to generate error values and locations. The error values and locations are then transmitted back to the row correction circuitry 410, which performs row error correction on the row on the fly using the error values and locations.

In general, the maximum number of errors correctable for a row or column is half the number of check bytes in the row or column. Hence, the maximum number of errors correctable for a row is half the number of check bytes in the row. For example, since a row typically includes 10 row check bytes, row correction can correct up to 5 errors in the row at one time. In one embodiment, the present invention allows a user to program the number of correctable errors for rows and columns.

The column and EDC syndrome generator circuitry 412 and the buffer 406 of FIG. 6 concurrently receive the error corrected rows sequentially from the row correction circuitry 410. The buffer 406 includes a receiving buffer 610 and a correction buffer 612. The buffer 406 receives the rows of the current ECC block being received in the receiving buffer 610. When all the rows of the current ECC block have been received in the receiving buffer 610, the current ECC block in the receiving buffer 610 becomes a previous ECC block and is either labeled as the correction buffer 612 or is transferred to the correction buffer 612 for performing column and/or repeat corrections. In this manner, a next ECC block can be received and stored in the receiving buffer 610.

In a preferred embodiment, the present invention utilizes a receiving buffer pointer to indicate the receiving buffer 610 and a correction buffer pointer to indicate the correction buffer 612. When all the rows of the current ECC block has been received in the receiving buffer 610, the receiving buffer pointer and the correction buffer pointer are switched. That is, the receiving buffer pointer now points to the correction buffer 612 and the correction buffer pointer points to the receiving buffer 610.

Alternatively, the current buffer can be used as a receiving buffer to receive a current ECC block. When all the rows of the current ECC block has been received, the current ECC block in the current buffer can be transferred to the correction buffer, where the error correction can be performed. In either case, these dual buffer configurations allow one buffer to receive a current ECC block while the other buffer is used to hold a previous ECC block for error correction.

While the buffer 406 is receiving the row correction processed rows, the column and EDC syndrome generator circuitry 412 also receives the same rows from the row correction circuitry 410. The column and EDC syndrome generator circuitry 412 receives each row in sequence and generates an interim column syndrome and an interim EDC syndrome for each of the bytes or columns in the received row. The interim column and EDC syndromes for each of the bytes are then stored in a syndrome memory.

When the next row of the ECC block is received, the column and EDC syndrome generator circuitry 412 computes a new interim column and EDC syndromes for each of the bytes in the row using the previous interim syndrome stored in the syndrome memory and the new bytes received. The new interim column and EDC syndromes are then stored in the syndrome memory according to their associated byte positions. Thus, the column and EDC syndrome generator circuitry 412 accumulates interim syndrome values for each bytes (i.e., columns) in the syndrome memory after processing each row. After the last row of the ECC block is received and processed, the final interim column syndromes generated by the column & EDC syndrome generator circuitry are the column syndromes for each of the columns in the ECC block.

Upon generating the column and EDC syndromes, the column and EDC syndrome generating circuitry 412 transmits the syndromes to the correction control circuitry 606. In response, the correction control circuitry 606 generates a column correction request and schedules access to the correction engine 608 for the column syndromes. When the request is acknowledged, the correction control circuitry 606 sends the column syndromes to the correction engine 608. Using the column syndromes, the correction engine 608 generates error location and error values in the column associated with the received column syndromes.

The correction engine 608 performs error correction computations. For example, the correction engine 608 uses the syndromes to generate an "error value" and "error location" for the row or column associated with the syndrome. The error value is then used by either the on-the-fly row correction circuitry 410 or the correction circuitry 602 to correct the errors. Circuitry for correcting errors in a row or column using error values and locations by, for example using one or more XOR gates, are well known in the art. The correction engine 608 implements well known algorithms for performing error correction computations. Exemplary algorithms for performing syndrome generation and error corrections are described, for example, in a co-pending U.S. patent application having Ser. No. 08/933,568, and entitled "METHOD AND APPARATUS FOR PERFORMING ERROR CORRECTION CODE OPERATIONS". This application is incorporated by reference herein.

The correction control circuitry 606 transmits the error location and error values to the correction circuitry 602. Using the error location and error values, the correction circuitry 602 performs correction in the column using the column data, which are now stored in the correction buffer 612. Each time a byte in the column is corrected, the correction control circuitry 606 updates the associated column and EDC syndromes in the syndrome memory. The corrected column is then stored into the correction buffer 612. In a preferred embodiment, the present invention utilizes the correction circuitry 602 to correct rows in the correction buffer 612 for subsequent repeat corrections as well as the columns.

When one or more errors still remain in the ECC block stored in the correction buffer 612 as indicated by row and column erasure pointers, the EDAC circuitry performs repeat row and column error corrections. When the row erasure pointers indicate row errors remaining in one or more rows, the row syndrome generator circuitry 604 generates row syndromes for each of the rows in sequence and transmits the generated syndromes to the correction control circuitry 606. On the other hand, when the column erasure pointers indicate column errors remaining in one or more columns, the column and EDC syndrome generator circuitry 412 transmits the syndromes stored in the syndrome memory to the correction control circuitry 606.

As mentioned above, the correction control circuitry 606 generates a correction request and transmits the syndromes to the correction engine 608 when the request is acknowledged. The correction engine 608 generates error locations and values from the syndromes. The correction control circuitry 606 receives the error locations and values from the correction engine and transmits the information to the correction circuitry 602. Using the error locations and values, the correction circuitry 602 corrects the errors in the corresponding row or column stored in the correction buffer 612. For column corrections, the correction control circuitry updates the column syndromes each time a byte in a column is corrected and stores the updated column syndromes to the syndrome memory. Similarly, for column and repeat corrections, the correction control circuitry updates the EDC syndromes each time a byte in a column or row is corrected and stores the updated EDC syndromes to the syndrome memory.

Figure 7:
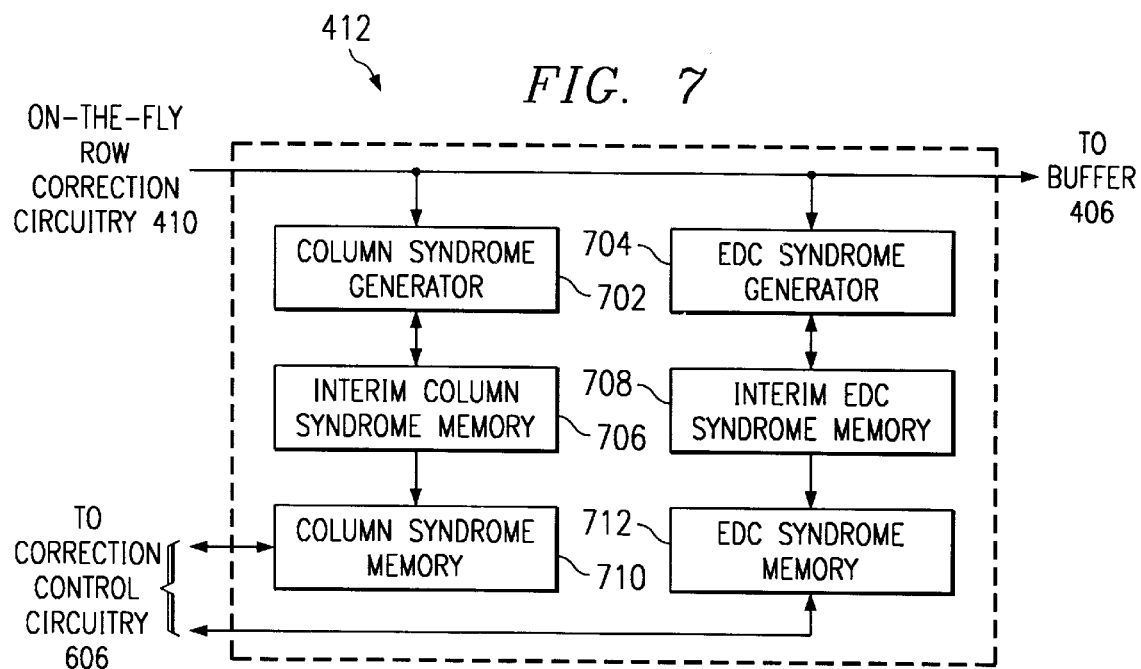
FIG. 7 illustrates a more detailed block diagram of the column and EDC syndrome generator circuitry.

FIG. 7A illustrates a more detailed block diagram of the column and EDC syndrome generator circuitry 412. The column and EDC syndrome generator circuitry 412 includes a column syndrome generator 702, an EDC syndrome generator 704, an interim column syndrome memory 706, an interim EDC syndrome memory 708, a column syndrome memory 710, and an EDC syndrome memory 712. The column syndrome generator 702 and the EDC syndrome generator 704 receive the row correction processed rows of an ECC block sequentially from the on-the-fly row correction circuitry and generate interim column syndromes and interim EDC syndromes, respectively for each of the bytes of columns in the ECC block. The column syndrome generator 702 is coupled to the interim column syndrome memory 706 and the EDC syndrome generator 704 is coupled to the interim EDC syndrome memory 708.

In this configuration, the column syndrome generator 702 stores the interim column syndromes for each of the bytes or columns in the ECC block into the interim column syndrome memory 706. Likewise, the EDC syndrome generator 704 stores the interim EDC syndromes for each of the bytes or columns in an ECC block into the interim EDC syndrome memory 708. The column and EDC syndrome generators 702 and 704, respectively, generate the next interim column and EDC syndromes, respectively, using the stored interim column and EDC syndromes and the corresponding bytes in the next row received from the on-the-fly row correction circuitry 410. This process continues until all the rows of the ECC block has been processed.

After the last row of the ECC block has been processed, the column and EDC syndrome generators 702 and 704, respectively, generate interim column syndromes and interim EDC syndromes for the entire ECC block and stores the interim syndromes in the interim column syndrome memory 706 and the interim ECD syndrome memory 708, respectively. Since these interim syndromes represent syndromes for the entire ECC block, the interim column and EDC syndromes are transferred to the column syndrome memory 710 the EDC syndrome memory 712, respectively, as column and EDC syndromes. The column and EDC syndromes in the column syndrome memory 710 and the ECD syndrome memory 712, respectively, are then transmitted to the correction control circuitry 606 one syndrome set at a time during correction. The correction control circuitry 606 updates the syndromes and writes the updated syndromes into the column syndrome memory 710 and the EDC syndrome memory 712 whenever corrections have been made.

Figure 8:
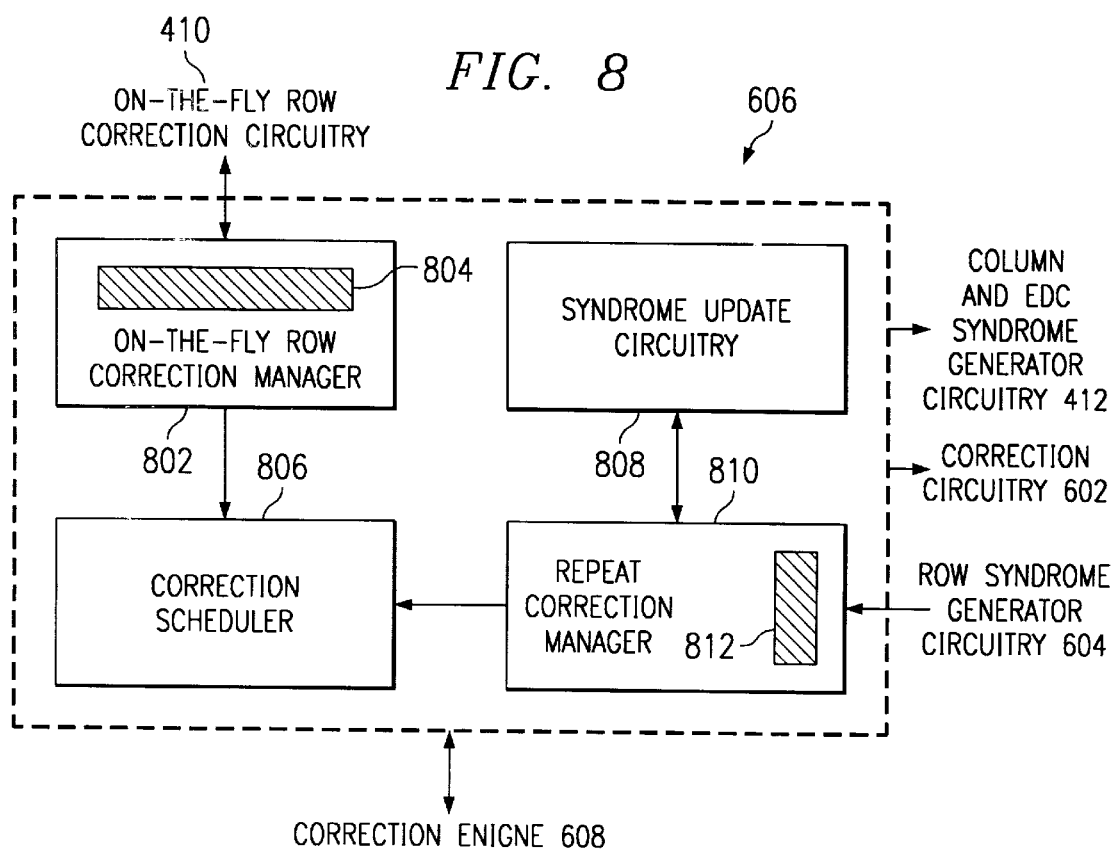
FIG. 8 illustrates a block diagram of the correction control circuitry.

FIG. 8 illustrates a block diagram of the correction control circuitry 606. The correction control circuitry 606 includes on-the-fly row correction manager 802, correction scheduler 806, syndrome update circuitry 808, and repeat correction manager 810. The on-the-fly row correction manager 802 includes a row syndrome buffer 804 for storing row syndromes from the on-the-fly row correction circuitry 410. Upon receiving a row syndromes, the on-the-fly row correction manager 802 copies the row syndromes into the row syndrome buffer 804 and generates a correction request signal. The on-the-fly row correction manager 802 is coupled to the correction scheduler 806 to transmit the correction request signal.

The syndrome update circuitry 808 receives column and EDC syndromes from the column and EDC syndrome generator circuitry 412 for updating the column and EDC syndromes. The syndrome update circuitry 808 keeps track of column and repeat corrections. Whenever a column or repeat correction is performed, the syndrome update circuitry 808 updates column and EDC syndromes and transmits the updated syndromes for storage in the column & EDC syndrome generator circuitry.

The repeat correction manager 810 receives row or column syndromes and copies the syndromes in a syndrome buffer 812. The repeat correction manager 810 then generates a correction request signal associated with the received syndrome and transmits the correction request signal to the correction scheduler 806. As will be discussed below, the correction scheduler 806 schedules correction requests received from the on-the-fly row correction manager 802 and the repeat correction manager 810.

FIG. 9 shows a flow diagram of exemplary operations of the on-the-fly row correction manager 802. The on-the-fly row correction manager 802 initially waits for a syndromes from the on-the-fly row correction circuitry 410 in operation 902. When a row syndrome is received, the on-the-fly row correction manager 802 copies the syndrome into the row syndrome buffer 804 in operation 904. Then in operation 906, the on-the-fly row correction manager 802 generates and sends a correction request to the correction scheduler 806. In operation 908, the on-the-fly row correction manager 802 waits for request acknowledgment signal from the correction scheduler 806. If the request is acknowledged, the on-the-fly row correction manager 802 returns to operation 902 to wait for another syndrome.

FIG. 10 illustrates a flow diagram of exemplary operations performed in the repeat correction manager 810. Initially in operation 1002, the repeat correction manager 810 waits for a column correction to end. Then in operation 1004, the repeat correction manager 810 determines if any errors remain in the ECC block stored in the correction buffer 612. If no error is present, the repeat correction terminates in operation 1016.

On the other hand, if one or more errors are present, the repeat correction manager 810 locates the rows containing errors in operation 1006. The repeat correction manager then reads a row with one or more errors in operation 1008 and uses the row syndrome generator circuitry 604 to generate syndromes for the row in operation 1010. After receiving and copying row syndromes, the repeat correction manager 810 generates and transmits a correction request to the correction scheduler 806 in operation 1012. The repeat correction manager 810 waits until the correction scheduler 806 acknowledges the request and grants use of the correction engine 608 in operation 1014. When the correction request is acknowledged, the repeat correction manager 810 proceeds to read another row with one or more errors in operation 1008.

FIG. 11 illustrates a flow chart of exemplary operations performed by the correction scheduler 806. Initially in operation 1102, the correction scheduler 806 determines if it has received a correction request from the on-the-fly row correction manager 802. If no current correction request is pending from the on-the-fly row correction manager 802, the correction scheduler determines whether a column or repeat correction request is pending in operation 1104. Accordingly in the preferred embodiment, the correction requests from the on-the-fly row correction manager 802 has priority over the column and repeat correction requests. If there is no repeat or column correction request, the correction scheduler proceeds back to operation 1102 to check for an on-the-fly row correction request. If there is a correction request in either operation 1102 or 1104, the correction scheduler 806 acknowledges the correction request in operation 1106 and grants the use of the correction engine 608 for error correction in operation 1108. The correction engine receives syndromes and computes error locations and error values used for error correction. The correction scheduler 806 then proceeds back to operation 1102 to determine whether a row correction request has been received from the on-the-fly row correction manger 802.

FIG. 12 shows a flow chart of exemplary operations performed by the syndrome update circuitry 808. Initially in operation 1202, the syndrome update circuitry determines whether a column or repeat correction is to be performed on an ECC block stored in the correction buffer 612. If such a correction is determined to be necessary, the syndrome update circuitry 808 obtains the error location and error value computed through the correction engine 608 in operation 1204. Otherwise, the syndrome update circuitry 808 waits until a column or repeat correction is to be performed on the ECC block. Using the error location and error value, the syndrome update circuitry 808 computes new column and EDC syndromes for the associated column and EDC syndrome bytes.

Advantageously, the device and method of the present invention can detect and correct errors in the rows of an ECC block data without waiting for an entire ECC block to be assembled in a buffer. By computing column syndromes while the rows are being received, the device and method of the present invention can perform column corrections, and repeat corrections if necessary, as soon as all the rows of the ECC block have been received. Accordingly, the present invention significantly speeds up the error detection and correction time. In addition, the present invention requires less buffer bandwidth to access the buffer in the error detection and correction process by minimizing reading data from the buffer.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention. By way of example, a VHDL® hardware description language available from IEEE of New York, N.Y. may be used to design an appropriate silicon-level layout. Although any suitable design tool may be used, another layout tool may include a hardware description language "Verilog®" tool available from Cadence Design Systems, Inc. of Santa Clara, Calif.

The invention may employ various computer-implemented operations involving data stored in computer systems to drive computer peripheral devices (i.e., in the form of software drivers). These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A device for detecting and correcting errors in error correction coded (ECC) data blocks, each ECC data block comprising a plurality of columns and rows, the ECC data blocks being read from a storage medium sequentially in rows, the device comprising:

on-the-fly row correcting circuitry configured to sequentially receive the rows of an ECC data block for detecting errors in each of the received rows and for correcting up to a first predetermined number of the errors in each of the received rows;

column correction circuitry coupled to the row correction circuitry to sequentially receive the row error corrected rows of the ECC data block for detected uncorrected errors, wherein the column correction circuitry is configured to correct uncorrected errors remaining in the columns of the ECC data block after the up to a first predetermined number of errors in each row have been corrected; and repeat correction circuitry coupled to the column correction circuitry for detecting and correcting remaining uncorrected errors in the ECC data block after on-the-fly row correction and column correction.

2. The device as recited in claim 1, wherein the ECC data block is coded in Reed-Solomon code.

3. The device of claim 1 wherein said storage medium is a DVD medium.

4. The device as recited in claim 1, wherein the on-the-fly row correction circuitry corrects up to the first predetermined number of errors in each of the received rows.

5. The device as recited in claim 4, wherein each row in the ECC data block contains 10 row check bytes.

6. The device as recited in claim 5, wherein the first predetermined number is 5.

7. The device as recited in claim 1, wherein the column correction circuitry corrects up to a second predetermined number of errors in the columns of the ECC data block having the uncorrected errors.

8. The device as recited in claim 7, wherein each column in the ECC data block contains 16 column check bytes.

9. The device as recited in claim 8, wherein the second predetermined number is 8.

10. The device of claim 1 further comprising:

a buffer coupled to the row correction circuitry for receiving the error corrected rows of the ECC data block as a receiving buffer and for storing the ECC data block as a correction buffer when all the rows of the ECC data block have been received.

11. The device as recited in claim 10, wherein the buffer further comprises:

a receiving buffer for receiving the rows of the ECC block; and a correction buffer for storing all the rows of the ECC block so that the receiving buffer can continue to receive the rows of a next ECC block.

12. The device of claim 10 wherein the device is configured to inter-operate with a host device and the buffer is contained within the host device.

13. The device of claim 12 wherein the host device is a computer.

14. The device as recited in claim 1, wherein the row correction circuitry, the column correction circuitry, and the repeat correction circuitry generate first row syndromes, column syndromes, and second row syndromes, respectively, for error detection and correction, wherein a non-zero syndrome indicates presence of one or more errors and a zero syndrome indicates no errors.

15. The device as recited in claim 14, wherein the column correction circuitry further comprises a column syndrome generator for generating column syndromes for each of the columns in the ECC data block.

16. The device as recited in claim 15, wherein the column correction circuitry includes a column syndrome generator circuitry for computing an interim column syndrome for each column in a row after receiving a row by combining a previous interim column syndrome with a corresponding byte in the received row.

17. The device as recited in claim 16, wherein the column correction circuitry further includes an interim column syndrome memory coupled to the column syndrome generator circuitry for storing the interim column syndromes, wherein the column correction circuitry updates the interim column syndromes after each row of the ECC data block is received.

18. The device as recited in claim 17, wherein the column syndrome generator circuitry generates the column syndromes for the ECC data block after receiving all the rows of the ECC data block.

19. The device as recited in claim 18, wherein the column correction circuitry further includes a column syndrome memory, wherein the column correction circuitry stores the column syndromes into the column syndrome memory.

20. The device as recited in claim 15, wherein the on-the-fly row correction circuitry comprises:
   a pair of row buffers for sequentially receiving and storing a current row of the ECC data block, wherein when one of the pair of row buffers is receiving a next row of the ECC data block and is functioning as a row receive buffer, the other row buffer stores the current row of the ECC data block and functions as a row correction buffer;
   an on-the-fly syndrome generator receiving the current row of the ECC data block and being configured to sequentially generate the first row syndrome for the current row; and
   error correction circuitry coupled to the on-the-fly row syndrome generator and being configured to receive the first row syndrome associated with the current row that is stored in the row correction buffer, wherein the error correction circuitry is configured to correct errors in the current row that is contained in the row correction buffer.

21. The device as recited in claim 20, wherein the pair of row buffers alternates as the receive buffer and as the correction buffer.

22. The device as recited in claim 20, wherein each of the pair of row buffers sequentially receives alternating rows of the ECC data block.

23. The device as recited in claim 20, wherein said error correction circuitry further comprises on-the-fly row error correction feedback circuitry coupled to the row correction buffer for correcting the errors corresponding to the error location of the current row, wherein the error correction feedback circuitry corrects the errors in the current row using the error value to generate a corrected row and stores the corrected row into said correction buffer.

24. The device as recited in claim 15 further comprising:
   a correction engine configured to receive the syndromes for generating an error value and an error location; and
   correction control circuitry coupled to receive the syndromes from the row correction circuitry, the column correction circuitry, and the repeat correction circuitry to schedule access to the correction engine.

25. The device as recited in claim 24, wherein the correction control circuitry comprises:
   on-the-fly row correction manager circuitry configured to receive the first row syndromes from the on-the-fly row correction circuitry for generating an on-the-fly row correction request;
   syndrome update circuitry for receiving and updating the column syndromes in the column syndrome memory each time a column is corrected;
   repeat correction manager circuitry configured to receive the column syndromes from the syndrome update circuitry for generating a column correction request, the repeat correction manager circuitry also being configured to receive the second row syndromes from the row syndrome generator circuitry for generating a repeat row correction request; and
   correction scheduling circuitry coupled to the on-the-fly correction manager circuitry and the repeat correction manager circuitry to receive the correction requests, wherein the correction scheduling circuitry schedules access to the correction engine.

26. The device as recited in claim 25, wherein the on-the-fly row correction request has priority over the column correction request and the repeat row correction request.

27. The device as recited in claims 25, wherein the column correction request has priority over the repeat row correction request.

28. The device as recited in claim 25, wherein the repeat correction manager circuitry selects a correction request from the column correction request and the repeat row correction request.

29. The device as recited in claim 28, wherein the repeat correction manager circuitry waits for the column correction associated with the column correction request to be completed before generating the repeat row correction request.

30. The device as recited in claim 24, wherein the repeat correction circuitry is a row syndrome generator circuitry for generating the second row syndromes for the remaining uncorrected errors in the ECC data block.

31. The device as recited in claim 30, further comprising correction circuitry coupled to received the error value and error location from the correction control circuitry for performing row and column corrections on the ECC data block.

32. The device as recited in claim 31, wherein the ECC data block comprises a plurality of sectors, the device further comprising:
   an error-detection code (EDC) syndrome generator circuitry coupled to the row correction circuitry to sequentially receive the row error corrected rows of the ECC data block for generating a plurality of EDC syndromes for each of the sectors in the ECC data block, wherein the EDC syndromes indicate errors in each of the associated sectors.

33. The device as recited in claim 32, wherein the EDC syndrome generator circuitry computes a plurality of interim EDC syndromes after receiving a row by accumulating the values of interim EDC syndromes.

34. The device as recited in claim 33, wherein the EDC syndrome generator circuitry further includes an interim column syndrome memory coupled to the column syndrome generator for storing the interim column syndromes, wherein the column correction circuitry updates the interim column syndromes as each row of the ECC data block is received.

35. The device as recited in claim 34, wherein the EDC syndrome generator circuitry further includes an EDC syndrome memory for storing the EDC syndromes.

36. A method for detecting and correcting errors in error correction code (ECC) data blocks, each ECC data block comprising a plurality of rows and columns, the method comprising:
   sequentially receiving the rows of an ECC data block;
   detecting errors in each of the received rows of the ECC data block and correcting up to a first predetermined number of the errors in each of the rows in the ECC data block;
   storing each of the corrected rows;
   while storing the corrected rows, receiving each of the corrected rows sequentially for detecting uncorrected errors in the columns of the ECC data block;
   correcting the uncorrected errors in the columns of the ECC data block when all the rows of the ECC data block have been stored; and
   detecting and correcting any remaining uncorrected errors in the ECC data block.

37. The method as recited in claim 36, wherein the remaining uncorrected errors are detected and corrected in the columns of the stored ECC data block.

38. The method as recited in claim 36, wherein the ECC data block is coded in Reed-Solomon code.

39. The method as recited in claim 36, wherein up to a second predetermined number of errors are corrected in the columns having the uncorrected errors in the ECC data block.

40. The method as recited in claim 39, wherein each row in the ECC data block contains 10 row check bytes.

41. The method as recited in claim 40, wherein the first predetermined number is 5.

42. The method as recited in claim 40, wherein each column in the ECC data block contains 16 column check bytes.

43. The method as recited in claim 42, wherein the second predetermined number is 8.

44. The method as recited in claim 36, wherein the remaining uncorrected errors are detected and corrected in the rows of the stored ECC data block.

45. The method as recited in claim 44, wherein the errors in the rows, the uncorrected errors in the columns, and the remaining uncorrected errors are detected and corrected by generating first row syndromes, column syndromes, and second row syndromes, respectively, wherein a non-zero syndrome indicates presence of one or more errors and a zero syndrome indicates no errors.

46. The method as recited in claim 45, wherein when all the rows of the row corrected rows of the ECC data block have been received, the ECC data block is stored for detecting and correcting the uncorrected errors while a next ECC data block is being received.

47. The method as recited in claim 45, wherein the column syndromes are generated for each of the columns in the ECC data block.

48. The method as recited in claim 47, wherein an interim column syndrome is generated and stored for each column in a row after receiving each row of the ECC data block by updating the interim column syndrome.

49. The method as recited in claim 48, wherein the updated interim column syndrome after receiving the last row of the ECC data block for each column is the column syndrome.

50. The method as recited in claim 49, wherein the column syndromes are stored in a column syndrome memory.

51. The method as recited in claim 45, further comprising:
generating a plurality of correction requests for the first row syndromes, the column syndromes, and the second row syndromes, one correction request per syndrome;
selecting a correction request for computing error values and error locations for the syndrome associated with the selected correction request; and
correcting an error associated with the selected correction request.

52. The method as recited in claim 51, wherein the ECC data block comprises a plurality of sectors, the method further comprising:
sequentially receiving the row error corrected rows of the ECC data block for generating a plurality of EDC syndromes for each of the sectors in the ECC data block, wherein the EDC syndromes indicate errors in each of the associated sectors.

53. The method as recited in claim 52, wherein the EDC syndromes are generated after receiving a row by accumulating a plurality of interim EDC syndromes.

54. The method as recited in claim 53, wherein the interim column syndromes are updated and stored after each row of the ECC data block is received.

55. The method as recited in claim 51, wherein an on-the-fly row correction request has priority over a column correction request and a repeat correction request.

56. The method as recited in claim 55, wherein the column correction request has priority over the repeat correction request.

57. The method as recited in claim 56, wherein the column correction request has priority over the repeat correction request.

58. A device for detecting and correcting errors in error correction code (ECC) blocks, each ECC block comprising a plurality of rows and columns, the device comprising:
a receiving means for sequentially receiving the rows of an ECC data block;
a row error detecting means for detecting errors in each of the received rows of the ECC data block and an on-the-fly row error correcting means for correcting up to a first predetermined number of the errors in each of the rows in the ECC data block;
a column error detecting means receiving each of the corrected rows sequentially for detecting uncorrected errors remaining in the columns of the ECC data block after the up to a first predetermined number of errors have been corrected;
a column error correcting means for correcting the uncorrected errors remaining in the columns of the ECC data block after the up to a first number of errors have been corrected; and
a repeat correction means for detecting and correcting any remaining uncorrected errors in the ECC data block.

59. The device of claim 58 further comprising storing means for storing each of the corrected rows.

60. The device of claim 58 wherein the column error detecting means and the column error correcting means operate on a first ECC data block stored in a buffer while a second ECC data block is being received by the device.

61. The device as recited in claim 58, wherein the repeat correction means detects and corrects the remaining uncorrected errors in the rows of the ECC data block.

62. The device as recited in claim 61, wherein the repeat correction means detects and corrects the remaining uncorrected errors in the columns of the ECC data block.

63. The device as recited in claim 61, the row error detecting means, the column error detecting means, and the repeat correction means generate first row syndromes, column syndromes, and second row syndromes, respectively, for error detection and correction, wherein a non-zero syndrome indicates presence of one or more errors and a zero syndrome indicates no errors.

64. The device as recited in claim 63, wherein the column error detecting means generates the column syndromes for each of the columns in the ECC data block.

65. The device as recited in claim 64, wherein the column error detecting means generates and stores an interim column syndrome for each column in a row by updating the interim column syndrome after receiving each row of the ECC data block.

66. The device as recited in claim 65, wherein the column error detecting means generates the column syndromes from the interim column syndromes after receiving the last row of the ECC data block.

67. The device as recited in claimed 66, wherein when all the row corrected rows of the ECC data block have been received, the column error detection means and column error correction means begin detecting and correcting, respectively, the uncorrected errors while a next ECC data block is being received.

68. The device as recited in claim 67, further comprising:
correction request means for generating a plurality of correction requests for the first row syndromes, the column syndromes, and the second row syndromes, one correction request per syndrome;

selecting means for selecting a correction request for computing error values and error locations for the syndrome associated with the selected correction request; and correction means for correcting an error associated with the selected correction request.

69. A device for detecting and correcting errors in error correction coded (ECC) data blocks, each ECC data block comprising a plurality of columns and rows, the ECC data blocks being read from a storage medium sequentially in rows, the device comprising:

on-the-fly row correction circuitry configured to sequentially receive the rows of an ECC data block for detecting and correcting errors in each of the received rows;

column correction circuitry coupled to the row correction circuitry to sequentially receive the row error corrected rows of the ECC data block for detecting uncorrected errors, wherein the column correction circuitry is configured to correct the uncorrected errors remaining in the columns of the ECC data block after detection and correction of errors in each of the received rows; and repeat correction circuitry for detecting and correcting remaining uncorrected errors in the ECC data block after the on-the-fly row correction and column correction.

70. The device of claim 69 further comprising a buffer coupled to the row correction circuitry for receiving the error corrected rows of the ECC data block as a receiving buffer and for storing the ECC data block as a correction buffer when all the rows of the ECC data block have been received.

71. The device of claim 69 wherein the buffer comprises a receiving buffer for receiving a first ECC data block and a correction buffer for storing a second ECC data block.

72. The device of claim 69 wherein the storage medium is a DVD medium.

73. The device as recited in claim 69, wherein the row correction circuitry, the column correction circuitry, and the repeat correction circuitry generate first row syndromes, column syndromes, and second row syndromes, respectively, for error detection and correction, wherein a non-zero syndrome indicates presence of one or more errors and a zero syndrome indicates no errors.

74. The device as recited in claim 73, wherein the column correction circuitry further comprises a column syndrome generator for generating the column syndromes for each of the columns in the ECC data block.

* * * * *